United States Patent [19]

Mawhinney

[11] 4,357,580

[45] Nov. 2, 1982

[54] WIDEBAND MICROWAVE FREQUENCY DIVIDER

[75] Inventor: Daniel D. Mawhinney, Livingston, N.J.

[73] Assignee: RCA Corporation, New York, N.Y.

[21] Appl. No.: 180,390

[22] Filed: Aug. 21, 1980

[51] Int. Cl.³ .................. H03L 7/02; H03L 7/06; H03L 7/24

[52] U.S. Cl. .................. 331/1 R; 331/10; 331/17; 331/18; 331/51

[58] Field of Search .................. 331/1 R, 9, 10, 17, 331/18, 23, 34, 51; 328/16–19, 25; 363/157, 165

[56] References Cited

U.S. PATENT DOCUMENTS

| | | | |
|---|---|---|---|
| 3,074,027 | 1/1963 | Rout | 331/2 |
| 3,304,518 | 2/1967 | Mackey | 332/19 |
| 3,626,315 | 12/1971 | Stirling et al. | 331/19 |
| 3,832,652 | 8/1974 | Upadhyayula et al. | 331/107 G |
| 4,063,188 | 12/1977 | Mawhinney | 331/11 |
| 4,063,279 | 12/1977 | Vidovic et al. | 358/19 |

OTHER PUBLICATIONS

Adler, "A Study of Locking Phenomenon in Oscillators," Proc. of I.R.E. and Waves and Electrons, vol. 34, Jun. 1946, pp. 351-357.

Primary Examiner—Siegfried H. Grimm
Attorney, Agent, or Firm—Samuel Cohen; Robert L. Troike; Raymond E. Smiley

[57] ABSTRACT

A signal of frequency value $F_{IN}$ is coupled to a discriminator and to one terminal of a voltage controlled oscillator (VCO) tuned to operate at a range of frequencies about $F_{IN} \div N$ where N is a nonunity positive integer. The discriminator produces a voltage proportional to frequency $F_{IN}$ which is scaled and applied to a control terminal of the VCO to cause it to be tuned to approximately $F_{IN} \div N$. The signal of frequency $F_{IN}$ applied to the VCO causes it to be injection locked to frequency $F_{IN} \div N$.

6 Claims, 1 Drawing Figure

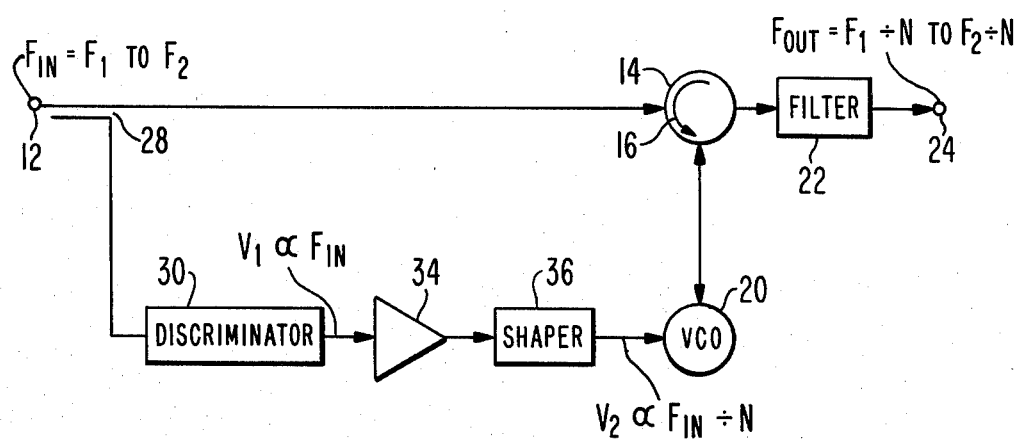

WIDEBAND MICROWAVE FREQUENCY DIVIDER

This invention relates to microwave frequency dividers and more particularly to microwave frequency dividers utilizing voltage controlled oscillators.

There are many applications for wideband microwave frequency dividers, especially for use in frequency synthesizers. It is known in the prior art to employ direct division using conventional flip-flop circuitry, but this is difficult to accomplish, costly and not yet feasible at frequencies above 1 gigahertz.

In accordance with a preferred embodiment of the instant invention, a circuit responsive to an input alternating signal of frequency $F_{IN}$ for producing an output signal of frequency $F_{IN} \div N$, where N is a nonunity integer, comprises means producing a voltage proportional to the value of the frequency of the input signal, a voltage controlled oscillator receptive of the input signal and correlation means responsive to the proportional voltage for supplying a tuning voltage to the voltage controlled oscillator which causes the oscillator to produce a signal of frequency approximately $F_{IN} \div N$. The input signal is applied to the voltage controlled oscillator causing it to be injection locked to $1 \div N$ the frequency $F_{IN}$ of the input signal.

In the drawing:

The sole FIGURE is a microwave frequency divider in schematic form in accordance with a preferred embodiment of the present invention.

A frequency $F_{IN}$ which may range from some relatively low frequency $F_1$ to some relatively high frequency $F_2$ is provided at terminal 12 from a source not shown. Terminal 12 is coupled to one port of a conventional three port circulator 14 having signal direction therethrough as indicated by arrow 16. A second port of circulator 14 is coupled to the oscillator output terminal of a conventional voltage controlled oscillator (VCO) 20 such a Watkins Johnson Model No. 2835-25. The third port of circulator 14 is connected to a filter 22 which in turn is coupled to an output terminal 24. In a manner to be described there is produced at terminal 24 in response to an input signal $F_{IN}$, an output signal $F_{OUT} = F_{IN} \div N$ which is equal to $F_1 \div N$ to $F_2 \div N$ where N is a nonunity positive integer, typically 2, 3, or 4.

A conventional coupler 28 is used to couple a portion of the input signal $F_{IN}$ to a discriminator 30 to which the coupler is connected. A suitable discriminator is described in U.S. Pat. No. 4,053,842 issued Oct. 11, 1977 to Z. Turski, et al. Discriminator 30 produces a voltage $V_1$ proportional to $F_{IN}$. Discriminator 30 is coupled to conventional amplifying means 34 which is, in turn, coupled to a correlation means such as a shaper circuit 36. The combination of amplifier 34 and shaper 36 produces an output voltage $V_2$ proportional to $F_{IN} \div N$. Voltage $V_2$ when applied to the control terminal of VCO 20, causes the VCO to produce a signal of frequency approximately $F_{IN} \div N$ in value. Typically, VCO 20 is designed to be capable of being locked to frequency $F_{IN} \div N$ but not $F_{IN}$.

In operation a signal of frequency $F_{IN}$ which may be any one of $F_1$ to $F_2$ in value, where by way of example, $F_1$ and $F_2$ are 7 and 11 gigahertz (GHz) respectively, is applied at terminal 12. Alternately $F_{IN}$ may be FM modulated and range from $F_1$ to $F_2$ as a function of time. The signal is applied to discriminator 30 which produces a voltage proportional to the value of frequency applied at terminal 12. The voltage produced by discriminator 30 is amplified in amplifier 34 and applied to a shaper circuit 36. The purpose of shaper circuit 36 is to produce a voltage $V_2$ which causes VCO 20, to which the shaper circuit is connected, to produce a frequency which is approximately $F_{IN} \div N$. That is, shaper circuit 36 is responsive to the voltage from discriminator 30 as amplified by amplifier 34 for converting that voltage to the voltage required by VCO 20 to produce frequency $F_{IN} \div N$. The shaper circuit is thus designed to take into consideration the frequency produced by the VCO 20 as a function of input voltage. Typically, the voltage $V_2$ is not able to tune VCO 20 to produce precisely the frequency $F_{IN} \div N$ because of various inaccuracies in the tuning curves of the VCO and in the shaping circuit. Simultaneous with the action just described, the input signal is applied via circulator 14 to the oscillator output terminal of VCO 20 as an injected signal. The injected signal appears to the VCO as a near harmonic and, by applying sufficient power, when the VCO is close enough to $F_{IN} \div N$, VCO 20 will be injection locked by the input frequency to precisely frequency $F_{IN} \div N$. The signal produced by VCO 20 is passed via circulator 14 to filter 22. The circulator performs an isolation function isolating the input signal at terminal 12 from the output signal produced by VCO 20. Filter 22 reduces the leakage harmonic signal $F_{IN}$ such that the frequency $F_{OUT}$ produced at terminal 24 is precisely the input frequency $F_{IN} \div N$.

For small excursions in the input frequency value (those within the locking range of VCO 20 which is a function of drive power to the VCO), such as caused by modulation, the VCO will follow instantly without a lag caused by the discriminator because the VCO will stay within the locking range. A basic paper on injection locking in oscillators is R. Alder, "A Study of Locking Phenomena in Oscillators," *Proc. I.R.E. and Waves and Electrons*, vol. 34, pp. 351-357, June, 1946.

What is claimed is:

1. A frequency divider circuit having an input terminal which is responsive to an input signal of frequency $F_{IN}$ for producing an output signal at an output terminal of frequency $F_{IN} \div N$, where N is a nonunity positive integer, comprising in combination:

means responsive to said input signal for producing a voltage signal proportional to the frequency of said input signal;

a voltage controlled oscillator (VCO) operable over a range of frequencies about $F_{IN} \div N$, said VCO having a control terminal;

a correlation means coupled to said control terminal and responsive to said proportional signal for applying a voltage to said VCO to tune it to operate at substantially frequency $F_{IN} \div N$, wherein application of the signal $F_{IN}$ to said VCO causes it to be tuned to produce a signal of frequency $F_{IN} \div N$, and means for applying said input signal $F_{IN}$ to said VCO for injection locking said VCO at $F_{IN} \div N$.

2. The combination as set forth in claim 1, wherein said means responsive to said input signal comprises a discriminator producing an output voltage proportional to the frequency of said input signal.

3. The combination as set forth in claim 2, wherein said correlation means comprises a shaper circuit responsive to said voltage from said discriminator for producing a drive voltage for said VCO which causes said VCO to produce a frequency substantially $F_{IN} \div N$ as said input signal varies in value.

4. The combination as set forth in claim 3, wherein said divider circuit further includes an isolation means coupled to said input terminal, said output terminal and said VCO for isolating said input signal from said output signal.

5. The combination as set forth in claim 4, wherein said divider circuit further includes a filter means coupled between said isolation means and said output terminal for blocking the frequency $F_{IN}$.

6. The combination as set forth in claim 4, wherein said isolation means comprises a three port circulator.

* * * * *